(12) United States Patent
Hou et al.

(10) Patent No.: US 9,651,604 B2
(45) Date of Patent: May 16, 2017

(54) GROUNDING GRID BREAKPOINT DIAGNOSTIC METHOD FOR TRANSIENT ELECTROMAGNETIC METHOD

(71) Applicants: State Grid Chongqing Electric Power Co. Electric Power Research Institute, Chongqing (CN); State Grid Corporation of China, Beijing (CN)

(72) Inventors: Xingzhe Hou, Chongqing (CN); Jin Fu, Chongqing (CN); Qian Wang, Chongqing (CN); Minghui Bao, Chongqing (CN); Gaolin Wu, Chongqing (CN); Shiyu Tang, Chongqing (CN); Yongliang Ji, Chongqing (CN); Wei Chen, Chongqing (CN)

(73) Assignees: State Grid Chongqing Electric Power Co. Electric Power Research Institute (CN); State Gride Corporation of China (CN)

( * ) Notice: Subject to any disclaimer, the term of this patent is extended or adjusted under 35 U.S.C. 154(b) by 0 days.

(21) Appl. No.: 14/897,501

(22) PCT Filed: Oct. 23, 2014

(86) PCT No.: PCT/CN2014/089307
§ 371 (c)(1),
(2) Date: Dec. 10, 2015

(87) PCT Pub. No.: WO2015/074473
PCT Pub. Date: May 28, 2015

(65) Prior Publication Data
US 2016/0178688 A1    Jun. 23, 2016

(30) Foreign Application Priority Data

Nov. 21, 2013  (CN) .......................... 2013 1 0589070
Feb. 27, 2014  (CN) .......................... 2014 1 0069150

(51) Int. Cl.
*G01R 31/02*  (2006.01)
*G01R 31/08*  (2006.01)

(52) U.S. Cl.
CPC ........... *G01R 31/08* (2013.01); *G01R 31/021* (2013.01); *G01R 31/026* (2013.01);
(Continued)

(58) Field of Classification Search
CPC ...... G01R 31/00; G01R 31/02; G01R 31/021; G01R 31/024; G01R 31/025; G01R 31/08;
(Continued)

(56) References Cited

U.S. PATENT DOCUMENTS

2004/0257216 A1* 12/2004 Parker .................... G08B 29/18
340/507
2008/0024142 A1*  1/2008 Opfer ..................... H01H 75/04
324/555

* cited by examiner

Primary Examiner — Hoai-An D Nguyen
(74) Attorney, Agent, or Firm — Martine Penilla Group, LLP

(57) ABSTRACT

A grounding grid breakpoint diagnostic method for a transient electromagnetic method, based on a transient electromagnetic detection apparatus. The method comprises: (101) disposing a test line at a position above a grounding grid to be diagnosed on the ground, and determining coordinates of a detection point; (102) obtaining information about coordinates of the detection point, and coinciding the center of the transient electromagnetic detection apparatus with the coordinates of the detection point; (103) performing, by the transient electromagnetic detection apparatus, measurement along the test line point by point, so as to obtain measurement data; (104) processing, by using diagram forming software, the measurement data to form a longitudinal resistivity cross-section diagram of the detection point according to a preset formula; (105) determining whether a
(Continued)

breakpoint occurs at the detection point according to the longitudinal resistivity cross-section diagram. The method does not depend on a design material of a grounding grid, and can implement non-excavation grounding grid breakpoint diagnosis without outage, thereby reducing economic losses in a diagnosis process.

6 Claims, 4 Drawing Sheets

(52) U.S. Cl.
CPC .......... *G01R 31/083* (2013.01); *G01R 31/085* (2013.01); *G01R 31/086* (2013.01)

(58) Field of Classification Search
CPC .. G01R 31/081; G01R 31/083; G01R 31/085; G01R 31/086
USPC ....... 324/500, 501, 509, 510, 511, 512, 522, 324/523, 525, 527, 528, 529, 530, 531
See application file for complete search history.

__(1)__

GROUNDING GRID BREAKPOINT DIAGNOSTIC METHOD FOR TRANSIENT ELECTROMAGNETIC METHOD

CLAIM OF PRIORITY

This application is a Section 371 National Stage Application of International Application No. PCT/CN2014/089307, filed on Oct. 23, 2014, and claiming priority of Chinese Patent Application No. CN20140069150.8, filed on Feb. 27, 2014; and Chinese Patent Application No. CN201310589070.0, filed on Nov. 21, 2013, the contents of which are incorporated herein by reference.

TECHNICAL FIELD

The present invention relates to the field of grounding grid breakpoint diagnostic technology in the electric power system, and more particularly to a grounding grid breakpoint diagnostic method for a transient electromagnetic method.

BACKGROUND ART

Integrity and reliability of the grounding grid are necessary to ensure the safe operation of the circuit system. Conductors constituting the grounding grid are buried under ground and are often broken due to poor welding and lack of welding under construction, soil erosion and other factors, thus causing degradation of the grounding discharge performance of the grounding grid, which is not only a threat to the equipment and personal safety, but also can bring huge economic losses and social impacts.

At present, the prior fault diagnostic techniques for the grounding grid are mainly based on the circuit theory, field-circuit method, nondestructive testing method and electrochemical method, but these methods either rely on design and construction drawings of the grounding grid or requires substation outage, and thus it is a technical problem to be urgently addressed during fully economic production in the electric power system to seek a novel diagnostic method and an apparatus independent of design information of the grounding grid and being capable of implementing non-excavation diagnosis without outage.

SUMMARY OF THE INVENTION

In view of the above, the present invention provides a grounding grid breakpoint diagnostic method for a transient electromagnetic method to overcome the problems of personal safety not being guaranteed and economic losses resulting from the fact that the prior fault diagnostic techniques for the grounding grid in the prior art are mainly based on the circuit theory, field-circuit method, nondestructive testing method and electrochemical method, but these methods either rely on design and construction drawings of the grounding grid or requires substation outage.

To achieve the above object, the present invention provides the following technical solutions: a grounding grid breakpoint diagnostic method, based on a transient electromagnetic detection apparatus including a transmitting system and a receiving system, said transmitting system including a battery pack, a transmitter and a transmitting coil, said receiving system including a receiver and a receiving coil, wherein said transmitting coil has its two ends respectively connected to current output ends of said transmitter, said battery pack has its anode connected to a positive power supply terminal of said transmitter and its cathode connected to a negative power supply terminal of said transmitter, and said receiving coil has its two ends respectively connected to signal acquisition lines of said receiver, the method comprising: disposing a test line at a position above a grounding grid to be diagnosed on the ground, and determining coordinates of a detection point; obtaining information about coordinates of the detection point, and coinciding the center of the transient electromagnetic detection apparatus with the coordinates of the detection point; performing, by the transient electromagnetic detection apparatus, measurement along the test line point by point, so as to obtain measurement data;

processing, by using diagram forming software, the measurement data to form a longitudinal resistivity cross-section diagram of the detection point according to a preset formula; and determining whether a breakpoint occurs at the detection point according to the longitudinal resistivity cross-section diagram;

wherein the processing, by using diagram forming software, the measurement data to form a longitudinal resistivity cross-section diagram of the detection point according to a preset formula is particularly: starting the transmitter of the transient electromagnetic detection apparatus to generate bipolar rectangular pulse current and establish a primary pulsed magnetic field; observing and sensing a secondary vortex field using the receiving coil of the transient electromagnetic detection apparatus and converting a secondary voltage signal stored in the receiver of the transient electromagnetic detection apparatus into a magnetic field signal; constructing and calculating a function of transient field parameters f(u) using a formula of a vertical component $B_z$ of the secondary field $$B_z = \frac{I\mu}{2a}\left[\frac{3}{\sqrt{\pi\mu}}e^{-u^2} + \left(1 - \frac{3}{2u^2}\right)\mathrm{erf}(u)\right],$$

the $f(u) = \frac{1}{u^2}\left[\frac{3u}{\sqrt{\pi}}e^{-u^2} + \left(u^2 - \frac{3}{2}\right)\mathrm{erf}(u)\right] - \frac{2aB_z}{\mu I},$ and calculating apparent resistivity ρ(t), the $$\rho(t) = \frac{a^2\mu}{4tu^2};$$

and calculating resistivity $\rho_r$ and apparent depth $H_r$ according to the apparent resistivity, and forming a longitudinal resistivity cross-section diagram of the detection point by using diagram forming software, the $$\rho_r = 4\left[\frac{\sqrt{t_j\rho_j} - \sqrt{t_i\rho_i}}{t_j - t_i}\right]^2 \times t_{ji},$$

the $H_r = 0.441 \times \frac{2}{\sqrt{\pi\mu}} \times (\sqrt{t_j\rho_j} + \sqrt{t_i\rho_i});$ wherein the determining whether a breakpoint occurs at the detection point according to the longitudinal resistivity cross-section diagram is particularly: performing grounding diagnosis by analyzing resistivity distribution on the longitudinal resistivity cross-section diagram; size of the resistivity at each detection point on the resistivity cross-section diagram depending on coupling of electromagnetic signals propagated downwards with the grounding grid when the transient electromagnetic detection apparatus is located at the detection point; determining the grounding grid to be intact if no breakpoint occurs to the grounding grid, which is manifested by a fact shown on the resistivity cross-section diagram that resistivity at a detection point above a conductor in the grounding grid is large while resistivity at detection points on both sides of the conductor in the grounding grid is small; and determining that a breakpoint occurs to the grounding grid if a breakpoint occurs to a conductor in the grounding grid, which is manifested by a fact shown on the resistivity cross-section diagram that resistivity at a detection point above a conductor with a breakpoint in the grounding grid is small while resistivity at detection points on both sides of the conductor is large; wherein the transmitting coil and the receiving coil are set as central loop means; wherein the transmitter generates bipolar rectangular pulse current and establishes a primary pulsed magnetic field via the transmitting coil; wherein the receiving coil observes and senses a secondary vortex field and stores it in a form of a secondary voltage signal in the receiver.

As can be known from the above technical solutions, as compared with the prior art, this invention discloses a grounding grid breakpoint diagnostic method, based on a transient electromagnetic detection apparatus, the method comprising: disposing a test line at a position above a grounding grid to be diagnosed on the ground, and determining coordinates of a detection point; obtaining information about coordinates of the detection point, and coinciding the center of the transient electromagnetic detection apparatus with the coordinates of the detection point; performing, by the transient electromagnetic detection apparatus, measurement along the test line point by point, so as to obtain measurement data; processing, by using diagram forming software, the measurement data to form a longitudinal resistivity cross-section diagram of the detection point according to a preset formula; and determining whether a breakpoint occurs at the detection point according to the longitudinal resistivity cross-section diagram. This method is independent of design information of the grounding grid and is capable of implementing non-excavation grounding grid breakpoint diagnosis without outage, thereby reducing economic losses in a diagnosis process.

DESCRIPTION OF DRAWINGS

In order to more clearly illustrate technical solutions in the examples of the present invention or in the prior art, the following part will give a simple introduction to drawings required in description about the examples or the prior art. Obviously, drawings in the following description are only examples of the present invention, and those of ordinary skill in the art can also obtain other drawings without creative work based on those provided.

DETAILED DESCRIPTION OF EMBODIMENTS

Provided below is a clear and complete description about the technical solutions in examples of the present invention, in conjunction with drawings in the examples of the present invention. Obviously, the described examples are only a part rather than all of the examples of the present invention. All other examples obtained by those of ordinary skill in the art without creative work based on those in the present invention are within the scope of the present invention.

This invention discloses a grounding grid breakpoint diagnostic method, based on a transient electromagnetic detection apparatus, the method comprising: disposing a test line at a position above a grounding grid to be diagnosed on the ground, and determining coordinates of a detection point; obtaining information about coordinates of the detection point, and coinciding the center of the transient electromagnetic detection apparatus with the coordinates of the detection point; performing, by the transient electromagnetic detection apparatus, measurement along the test line point by point, so as to obtain measurement data; processing, by using diagram forming software, the measurement data to form a longitudinal resistivity cross-section diagram of the detection point according to a preset formula; and determining whether a breakpoint occurs at the detection point according to the longitudinal resistivity cross-section diagram. This method is independent of design information of the grounding grid and is capable of implementing non-excavation grounding grid breakpoint diagnosis without outage, thereby reducing economic losses in a diagnosis process.

Figure 1:
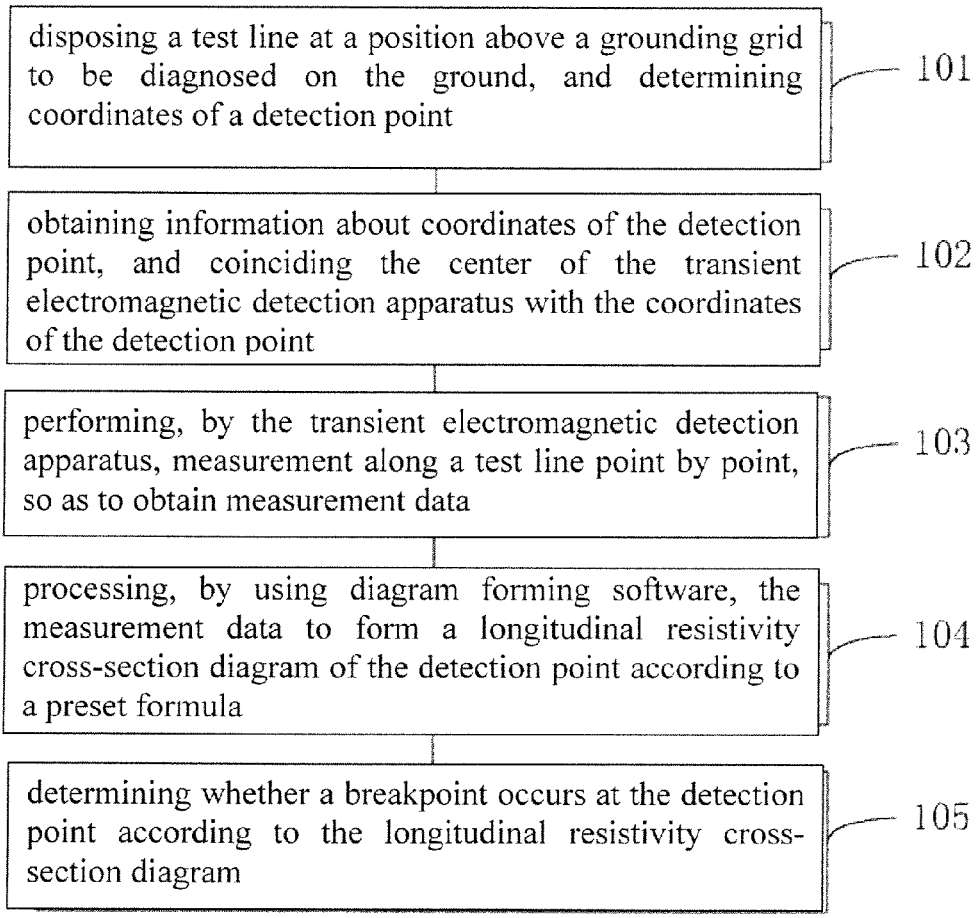
FIG. 1 is a flow chart for a grounding grid breakpoint diagnostic method disclosed by an example of this invention.
Figure 2:
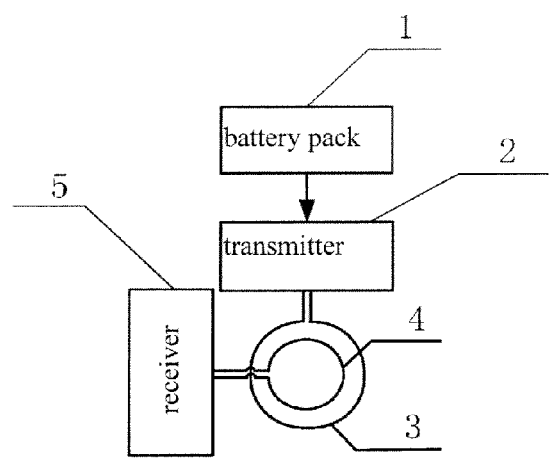
FIG. 2 is a schematic diagram of the structure of a transient electromagnetic detection apparatus in an example of this invention.

Reference can be made to FIG. 1 which is a flow chart for a grounding grid breakpoint diagnostic method disclosed by an example of this invention. Reference can be made to FIG. 2 which is a schematic diagram of the structure of a transient electromagnetic detection apparatus in an example of this invention. An example of this invention discloses a grounding grid breakpoint diagnostic method which is based on a transient electromagnetic detection apparatus; as shown in FIG. 2, the structure particularly includes a transmitting system and a receiving system, said transmitting system including a battery pack 1, a transmitter 2 and a transmitting coil 3, said receiving system including a receiver 4 and a receiving coil 5, wherein said transmitting coil 3 has its two ends respectively connected to current output ends of said transmitter 2, said battery pack 1 has its anode connected to a positive power supply terminal of said transmitter 2 and its cathode connected to a negative power supply terminal of said transmitter 2, and said receiving coil 5 has its two ends respectively connected to signal acquisition lines of said receiver 4.

Figure 3:
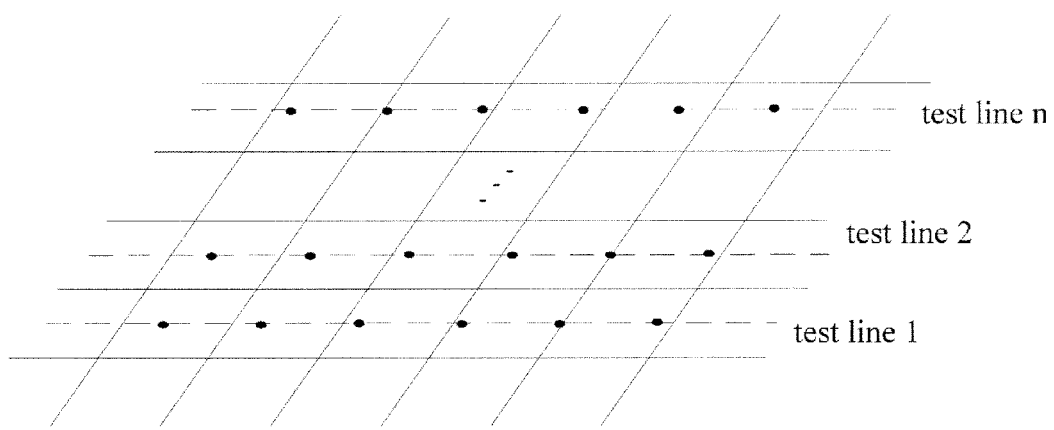
FIG. 3 is a schematic diagram of a grounding grid disclosed in an example of this invention.
Figure 4:
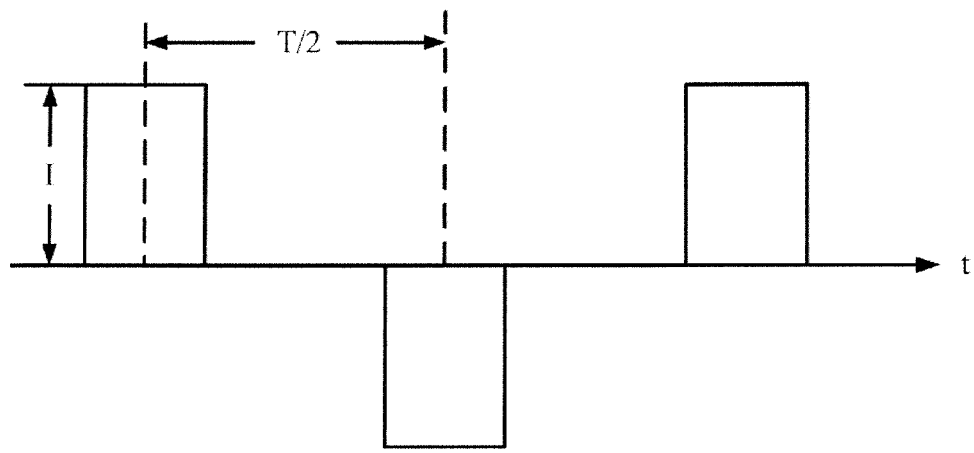
FIG. 4 is an oscillogram of bipolar rectangular pulse current generated by the transmitter in an example of this invention.

On the basis of being based on the above transient electromagnetic detection apparatus, the method particularly comprises steps of:

Step 101: disposing a test line at a position above a grounding grid to be diagnosed on the ground, and determining coordinates of a detection point;

for details, please refer to FIG. 3 which is a schematic diagram of a grounding grid disclosed in an example of this invention;

Step 102: obtaining information about coordinates of the detection point, and coinciding the center of the transient electromagnetic detection apparatus with the coordinates of the detection point;

Step 103: performing, by the transient electromagnetic detection apparatus, measurement along the test line point by point, so as to obtain measurement data;

specifically, when an experiment is carried out, an integrated coil means constituted by the transmitting coil and the receiving coil of the transient electromagnetic detection apparatus should have its center coincided with the detection point and performs measurement along the test line point by point;

Step 104: processing, by using diagram forming software, the measurement data to form a longitudinal resistivity cross-section diagram of the detection point according to a preset formula; specifically, this step comprises detailed steps of: starting the transmitter of the transient electromagnetic detection apparatus to generate bipolar rectangular pulse current and establish a primary pulsed magnetic field; referring to FIG. 4 which is an oscillogram of bipolar rectangular pulse current generated by the transmitter in an example of this invention, wherein the horizontal axis is the coordinate of time (t) and the vertical axis is the coordinate of current (I), and which shows that the bipolar rectangular pulse current has a period of T; observing and sensing a secondary vortex field using the receiving coil of the transient electromagnetic detection apparatus and converting a secondary voltage signal stored in the receiver of the transient electromagnetic detection apparatus into a magnetic field signal;

constructing and calculating a function of transient field parameters f(u) using a formula of a vertical component $B_z$ of the secondary field, the $$f(u) = \frac{1}{u^2}\left[\frac{3u}{\sqrt{\pi}}e^{-u^2} + \left(u^2 - \frac{3}{2}\right)\mathrm{erf}(u)\right] - \frac{2aB_z}{\mu I},$$

and calculating apparent resistivity ρ(t), the $$\rho(t) = \frac{a^2\mu}{4tu^2},$$

wherein in the above formula of a vertical component $B_z$ of the secondary field, I is the value of rectangular pulse current transmitted by the transmitter, a is the radius of the transmitting coil, μ is homogeneous half space magnetic conductivity, which is approximately $4\pi\times10^{-7}$ H/m, u is a transient field parameter, $\mathrm{erf}(u) = 2\int_0^u e^{-t^2} dt/\sqrt{\pi}$ is an error function; and specifically, in examples of this invention, the above parameters mean the same as the parameters appearing in the following formulas and description on the same parameters hereinbelow will not be repeated; and calculating resistivity $\rho_r$ and apparent depth $H_r$ according to the apparent resistivity, and forming a longitudinal resistivity cross-section diagram of the detection point by using diagram forming software, the $$\rho_r = 4\left[\frac{\sqrt{t_j\rho_j} - \sqrt{t_i\rho_i}}{t_j - t_i}\right]^2 \times t_{ji},$$

-continued the $H_r = 0.441 \times \frac{2}{\sqrt{\pi\mu}} \times (\sqrt{t_j\rho_j} + \sqrt{t_i\rho_i})$, wherein in the above formulas of resistivity $\rho_r$ and apparent depth $H_r$, $t_j$ and $t_i$ are two-phase sampling time, $t_j > t_i$, $t_{ji}$ is the arithmetic mean of sampling time $t_j$ and $t_i$, and $\rho_j$ and $\rho_i$ are apparent resistivity corresponding to sampling time $t_j$ and $t_i$;

Step 105: determining whether a breakpoint occurs at the detection point according to the longitudinal resistivity cross-section diagram.

specifically, this step comprises detailed steps of: performing grounding diagnosis by analyzing resistivity distribution on the longitudinal resistivity cross-section diagram; size of the resistivity at each detection point on the resistivity cross-section diagram depending on coupling of electromagnetic signals propagated downwards with the grounding grid when the transient electromagnetic detection apparatus is located at the detection point; determining the grounding grid to be intact if no breakpoint occurs to the grounding grid, which is manifested by a fact shown on the resistivity cross-section diagram that resistivity at a detection point above a conductor in the grounding grid is large while resistivity at detection points on both sides of the conductor in the grounding grid is small; and determining that a breakpoint occurs to the grounding grid if a breakpoint occurs to a conductor in the grounding grid, which is manifested by a fact shown on the resistivity cross-section diagram that resistivity at a detection point above a conductor with a breakpoint in the grounding grid is small while resistivity at detection points on both sides of the conductor is large.

This example discloses a grounding grid breakpoint diagnostic method, based on a transient electromagnetic detection apparatus, the method comprising: disposing a test line at a position above a grounding grid to be diagnosed on the ground, and determining coordinates of a detection point; obtaining information about coordinates of the detection point, and coinciding the center of the transient electromagnetic detection apparatus with the coordinates of the detection point; performing, by the transient electromagnetic detection apparatus, measurement along the test line point by point, so as to obtain measurement data; processing, by using diagram forming software, the measurement data to form a longitudinal resistivity cross-section diagram of the detection point according to a preset formula; and determining whether a breakpoint occurs at the detection point according to the longitudinal resistivity cross-section diagram. This method is independent of design information of the grounding grid and is capable of implementing non-excavation grounding grid breakpoint diagnosis without outage, thereby reducing economic losses in a diagnosis process.

A detailed description has been made on the method in the above examples disclosed in this invention. This invention further discloses a transient electromagnetic detection apparatus and concrete examples will be given below to give a detailed description.

Preferably, the transmitting coil 3 and the receiving coil 4 as described above are set as a central loop means, the transmitting coil 3 and the receiving coil 4 can be set as a concentric integrated coil, and the transmitting coil and the receiving coil are not in communication with each other.

In practice, the measurement is performed by the center of a transient electromagnetic coil means in FIG. 2 along the test line, and whenever each measurement is performed, the central loop means has its center coincided with the detection point.

In the apparatus, the transmitter 2 generates bipolar rectangular pulse current and establishes a primary pulsed magnetic field via the transmitting coil 3.

In the apparatus, the receiving coil 4 observes and senses a secondary vortex field and stores it in a form of a secondary voltage signal in the receiver.

Figure 5:
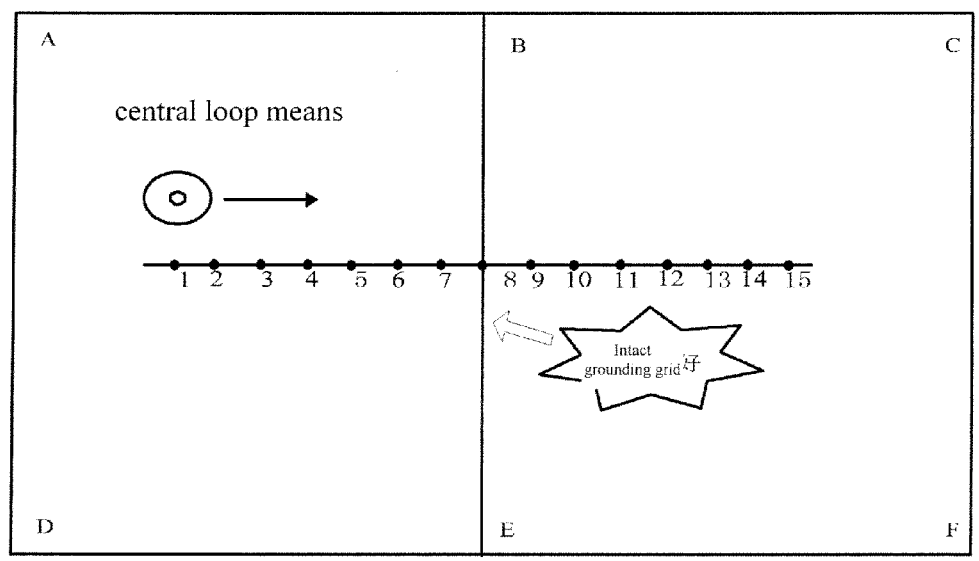
FIG. 5 is a diagram showing the relative position of coil means and the intact grounding grid in an example of this invention.
Figure 6:
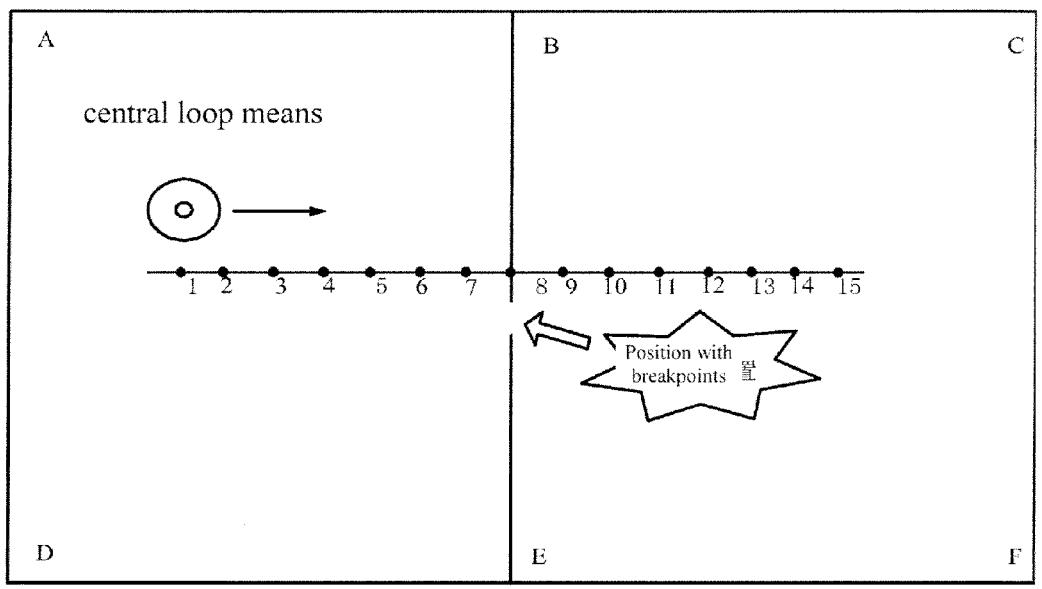
FIG. 6 is a diagram showing the relative position of coil means and the grounding grid with a breakpoint in an example of this invention.

Referring to FIG. 5 and FIG. 6, FIG. 5 is a diagram showing the relative position of coil means and the intact grounding grid in an example of this invention; and FIG. 6 is a diagram showing the relative position of coil means and the grounding grid with a breakpoint in an example of this invention. The measurement is performed by the central loop means in FIG. 5 and FIG. 6 along the test line, and whenever each measurement is performed, the central loop means has its center coincided with the detection point.

In FIG. 5, Detection Point No. 8 is located directly above a length of conductor in the grounding grid, Detection Point Nos. 3-13 are spaced from each other at an interval of 20 cm, Detection Point Nos. 1-3 or 13-15 are spaced from each other at an interval of 40 cm; when the grounding grid is intact, if the integrated coil means is located within two closed meshes ABED and BCFE, electromagnetic signals propagated downwards will be mainly coupled with small closed meshes, coupling will be strong, and lower resistivity will be displayed on the resistivity cross-section diagram; if the integrated coil means is located above a conductor BE in the grounding grid, electromagnetic signals propagated downwards will be coupled with both of the small meshes, a vortex formed on the length of conductor BE will flow in a contrary direction to weaken coupling degree, and higher resistivity will be displayed on the resistivity cross-section diagram, and therefore, the longitudinal resistivity cross-section diagram displays higher resistivity at Detection Point Nos. 6-10 than detection points on both sides.

In FIG. 6, when the length of conductor BE in the grounding grid has breakpoints, small meshes ABED and Bath of the grounding grid exhibit an open-circuit characteristic; when the integrated coil means is located in the middle of the meshes, lower resistivity is displayed on the resistivity cross-section diagram; when the integrated coil means is located at detection points on both sides, higher resistivity is displayed on the resistivity cross-section diagram, and therefore, the longitudinal resistivity cross-section diagram displays lower resistivity at Detection Point Nos. 6-10 than detection points on both sides. Through the above analysis, the presence of breakpoints at this position can be diagnosed.

This invention discloses a transient electromagnetic detection apparatus which implements non-excavation grounding grid breakpoint diagnosis without outage, thereby reducing economic losses in a diagnosis process.

To conclude, this invention discloses a grounding grid breakpoint diagnostic method, based on a transient electromagnetic detection apparatus, the method comprising: disposing a test line at a position above a grounding grid to be diagnosed on the ground, and determining coordinates of a detection point; obtaining information about coordinates of the detection point, and coinciding the center of the transient electromagnetic detection apparatus with the coordinates of the detection point; performing, by the transient electromagnetic detection apparatus, measurement along the test line point by point, so as to obtain measurement data; processing, by using diagram forming software, the measurement data to form a longitudinal resistivity cross-section diagram of the detection point according to a preset formula; and determining whether a breakpoint occurs at the detection point according to the longitudinal resistivity cross-section diagram. This method is independent of design information of the grounding grid and is capable of implementing non-excavation grounding grid breakpoint diagnosis without outage, thereby reducing economic losses in a diagnosis process.

The previous description on the disclosed examples enables those skilled in the art to achieve or use this invention. Various modifications to these examples will be obvious to those skilled in the art, and the general principles defined herein may be realized in other examples without departing from the spirit or scope of the present invention. Accordingly, the present invention will not be limited to these examples shown herein, but should comply with the widest range consistent with the principles and novel features disclosed herein.

What is claimed is:

1. A grounding grid breakpoint diagnostic method, based on a transient electromagnetic detection apparatus including a transmitting system and a receiving system, said transmitting system including a battery pack, a transmitter and a transmitting coil, said receiving system including a receiver and a receiving coil, wherein said transmitting coil has its two ends respectively connected to current output ends of said transmitter, said battery pack has its anode connected to a positive power supply terminal of said transmitter and its cathode connected to a negative power supply terminal of said transmitter, and said receiving coil has its two ends respectively connected to signal acquisition lines of said receiver, characterized in that the method comprises:
    disposing a test line at a position above a grounding grid to be diagnosed on the ground, and determining coordinates of a detection point;
    obtaining information about coordinates of the detection point, and coinciding the center of the transient electromagnetic detection apparatus with the coordinates of the detection point;
    performing, by the transient electromagnetic detection apparatus, measurement along the test line point by point, so as to obtain measurement data;
    processing, by using diagram forming software, the measurement data to form a longitudinal resistivity cross-section diagram of the detection point according to a preset formula; and
    determining whether a breakpoint occurs at the detection point according to the longitudinal resistivity cross-section diagram.

2. The method as recited in claim 1, characterized in that the processing, by using diagram forming software, the measurement data to form a longitudinal resistivity cross-section diagram of the detection point according to a preset formula is particularly:
    starting the transmitter of the transient electromagnetic detection apparatus to generate bipolar rectangular pulse current and establish a primary pulsed magnetic field;
    observing and sensing a secondary vortex field using the receiving coil of the transient electromagnetic detection apparatus and converting a secondary voltage signal stored in the receiver of the transient electromagnetic detection apparatus into a magnetic field signal;
    constructing and calculating a function of transient field parameters f(u) using a formula of a vertical component $B_z$ of the secondary field $$B_z = \frac{I\mu}{2a}\left[\frac{3}{\sqrt{\pi\mu}}e^{-u^2} + \left(1 - \frac{3}{2u^2}\right)\text{erf}(u)\right],$$

the $$f(u) = \frac{1}{u^2}\left[\frac{3u}{\sqrt{\pi}}e^{-u^2} + \left(u^2 - \frac{3}{2}\right)\text{erf}(u)\right] - \frac{2aB_z}{\mu I},$$

and calculating apparent resistivity ρ(t), the $$\rho(t) = \frac{a^2\mu}{4tu^2};$$

and
calculating resistivity $\rho_r$ and apparent depth $H_r$ according to the apparent resistivity, and forming a longitudinal resistivity cross-section diagram of the detection point by using diagram forming software, the $$\rho_r = 4\left[\frac{\sqrt{t_j\rho_j} - \sqrt{t_i\rho_i}}{t_j - t_i}\right]^2 \times t_{ji},$$

the $$H_r = 0.441 \times \frac{2}{\sqrt{\pi\mu}} \times \left(\sqrt{t_j\rho_j} + \sqrt{t_i\rho_i}\right).$$

3. The method as recited in claim 1, characterized in that the determining whether a breakpoint occurs at the detection point according to the longitudinal resistivity cross-section diagram is particularly:
performing grounding diagnosis by analyzing resistivity distribution on the longitudinal resistivity cross-section diagram;
size of the resistivity at each detection point on the resistivity cross-section diagram depending on coupling of electromagnetic signals propagated downwards with the grounding grid when the transient electromagnetic detection apparatus is located at the detection point;
determining the grounding grid to be intact if no breakpoint occurs to the grounding grid, which is manifested by a fact shown on the resistivity cross-section diagram that resistivity at a detection point above a conductor in the grounding grid is large while resistivity at detection points on both sides of the conductor in the grounding grid is small; and
determining that a breakpoint occurs to the grounding grid if a breakpoint occurs to a conductor in the grounding grid, which is manifested by a fact shown on the resistivity cross-section diagram that resistivity at a detection point above a conductor with a breakpoint in the grounding grid is small while resistivity at detection points on both sides of the conductor is large.

4. The method as recited in claim 1, characterized in that the transmitting coil and the receiving coil are set as central loop means.

5. The method as recited in claim 1, characterized in that the transmitter generates bipolar rectangular pulse current and establishes a primary pulsed magnetic field via the transmitting coil.

6. The method as recited in claim 1, characterized in that the receiving coil observes and senses a secondary vortex field and stores it in a form of a secondary voltage signal in the receiver.

* * * * *